United States Patent [19]
Mech

[11] Patent Number: 5,866,968
[45] Date of Patent: Feb. 2, 1999

[54] SINGLE-INPUT PHASE LOCKING PIEZOELECTRIC TRANSFORMER DRIVING CIRCUIT

[75] Inventor: Harold W. Mech, Albuquerque, N. Mex.

[73] Assignee: Motorola Inc., Schaumburg, Ill.

[21] Appl. No.: 852,505

[22] Filed: May 7, 1997

[51] Int. Cl.[6] ................................................ H01L 41/04
[52] U.S. Cl. ........................ 310/314; 310/316; 310/318
[58] Field of Search ................................. 310/314, 318, 310/316

[56] References Cited

U.S. PATENT DOCUMENTS

| | | | |
|---|---|---|---|
| 2,830,274 | 4/1958 | Rosen | 310/358 |
| 3,679,918 | 7/1972 | Keizi | 310/8.1 |
| 3,778,648 | 12/1973 | Kawada | 310/8.1 |
| 4,302,728 | 11/1981 | Nakamura | 331/25 |
| 4,459,505 | 7/1984 | Lim | 310/318 |
| 5,177,900 | 1/1993 | Solowiej | 49/363 |
| 5,329,200 | 7/1994 | Zaitsu | 310/316 |
| 5,341,061 | 8/1994 | Zaitsu | 310/318 |
| 5,391,001 | 2/1995 | Rupert et al. | 374/130 |
| 5,424,935 | 6/1995 | Wu | 363/97 |
| 5,548,189 | 8/1996 | Williams | 315/224 |

*Primary Examiner*—Clayton LaBalle
*Assistant Examiner*—Timothy A Williams
*Attorney, Agent, or Firm*—Brian M. Mancini; Gary J. Cunningham

[57] ABSTRACT

A circuit (10) for driving a piezoelectric transformer (12) in a phase locked mode without using an external reference signal. The circuit (10) utilizes a 555 timer circuit operated in a stable mode which is responsive to a feedback phase signal (18) coupled from an output signal (20) of the piezoelectric transformer (12). The feedback phase signal (18) overpowers the trigger circuit of the timer to phase lock the timer to an output of the piezoelectric transformer (12) at a resonant frequency of the piezoelectric transformer (12). The circuit (10) provides a simplified phase lock circuit without the need for a typical PLL configuration.

14 Claims, 3 Drawing Sheets

5,866,968

SINGLE-INPUT PHASE LOCKING PIEZOELECTRIC TRANSFORMER DRIVING CIRCUIT

FIELD OF THE INVENTION

The invention relates generally to the field of electrical power circuits for transformers, and in particular, to a phase locked piezoelectric transformer driver circuit.

BACKGROUND OF THE INVENTION

Generally, piezoelectric transformers are used in power supplies for televisions, photocopiers, LCD backlights and the like. Prior art piezoelectric transformers are based on the well known Rosen design (U.S. Pat. No. 2,830,274). These prior art high voltage transformer designs are of a piezoelectric ceramic plate which includes a driving section and a driven section which each have different polarizations. The different polarizations provide for voltage transformation.

Piezoelectric transformers are inherently high Q resonators which must be driven at a particular resonant frequency to allow maximum energy transfer to occur for a given output load. There are drawbacks to this, in that, the resonant frequency point of the piezoelectric transformer is dependent on external variables including time, temperature, output load and other variables. These variables cause the optimum power output of the transformer to degrade as frequency shifts unless the driving frequency can be continually corrected. If a driving circuit is unable to track the resonant frequency, the piezoelectric transformer will not be operated most effectively.

Prior art driving circuits have used fixed frequency oscillators with methods to lower the Q of a piezoelectric transformer. Lowering Q, by its very nature, results in less than optimum operating efficiency. In addition, operating at a fixed frequency is inefficient for the reasons outlined above. What is needed is a feedback mechanism to control the driving frequency. However, using voltage feedback is unstable since peak power occurs at a crest of the voltage output curve. In this instance, it is just as easy for a minor voltage feedback variation to adjust the driving frequency upwards as it is to adjust it downwards. This is not desirable, in that, if the feedback causes the frequency to go in the wrong direction, the loop will be 180° off phase and will lock at a low power point.

Phase locked loops are known in the art and have been used to control oscillator frequency. However, phase locked loops have not been applied to controlling piezoelectric transformers. Due to their high-Q nature, piezoelectric transformers require much tighter phase regulation and sensitivity than is available in existing phase locked loops. Typically, phase lock loops compare the phase of two AC signals and provide a DC correction voltage to an AC driving circuit for an oscillator. In addition, phase locked loop circuits typically require loop filters to prevent noise on the DC signal from interfering with the operation of the driving circuit. Also, commercial phase locked loops are complicated circuits particularly adapted for frequency channel switching with quick locking. These capabilities are not required or desired for driving a narrowly confined frequency of a piezoelectric transformer.

A need exists for an improved driving circuit for a piezoelectric transformer which is low cost, uses off-the-shelf components, and provides tight phase regulation and good sensitivity. Also, a need exists for an improved driving circuit for a piezoelectric transformer which does not require DC conversion. In addition, a need exists for an improved driving circuit for a piezoelectric transformer which does need a reference signal and tracks the resonant frequency of the piezoelectric transformer being driven so as to operate at maximum efficiency and/or power output for dynamic loading conditions.

DETAILED DESCRIPTION OF THE PREFERRED EMBODIMENT

The present invention is a piezoelectric transformer driving circuit which is locked to a phase signal from an output of the piezoelectric transformer. In a first embodiment, the phase signal is used to trigger a low-cost, off-the-shelf timing circuit which controls a driving frequency to a driving circuit coupled to an input of the piezoelectric transformer. This is accomplished without the use of DC conversion. Advantageously, the driving circuit for the piezoelectric transformer tracks the resonant frequency of the piezoelectric transformer being driven so as to operate at maximum efficiency and power output. In a second embodiment, the phase signal is used to trigger a modified low-cost, off-the shelf phase locked loop circuit which provides tight phase regulation and good sensitivity.

For the present invention, phase control of the driving frequency is monotonic, i.e. stable at only one operating point. In addition, the phase control of the piezoelectric transformer is substantially linear at the peak output point of the piezoelectric transformer. This results in a stable loop phase/frequency control of the output voltage (and power) of the piezoelectric transformer. Moreover, the phase control can be adjusted to additionally track the peak output point of the piezoelectric transformer such that optimum efficiency and output is maintained for dynamic load conditions.

Figure 1:
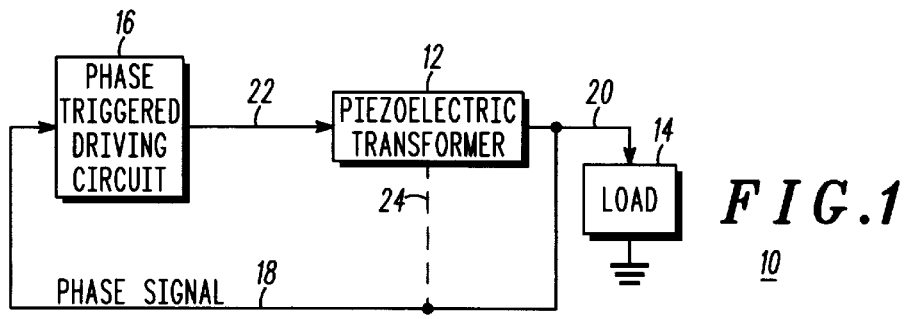
FIG. 1 is a block diagram of a simplified transformer circuit for a piezoelectric transformer, in accordance with the present invention.

Referring to FIG. 1, the present invention is a piezoelectric transformer driving circuit 10 which includes a piezoelectric transformer 12 with an output 20 coupled to a load 14, and a phase triggered driving circuit 16 which is coupled to an input of the piezoelectric transformer 12. In addition, the piezoelectric transformer 12 provides a feedback phase signal 18 which is coupled to the phase triggered driving circuit 16. The phase signal 18 is derived from the output 20 of the piezoelectric transformer 12. Alternatively, the phase signal 18 can be derived from an auxiliary tap 24 on the piezoelectric transformer 12. The auxiliary tap 24 has the advantage of being electrically decoupled from both the input and output electrodes of the piezoelectric transformer 12. Also, the auxiliary tap 24 provides a more usable lower signal level than is available from the high voltage output 20. The phase of the output signal 20 from the piezoelectric transformer 12 is utilized to control a driving frequency 22 of the phase triggered driving circuit 16 coupled to the input of the piezoelectric transformer 12. In this way, the phase signal 18 triggers the driving circuit 16 such that the piezoelectric transformer input becomes phase locked to driving circuit 16.

A Rosen-type piezoelectric ceramic transformer, which is well known in the art, was used in the present invention and operated in a thickness extensional mode. However, it should be recognized that the present invention can be used to drive a multitude of different piezoelectric transformer types with different operational modes.

Figure 2:
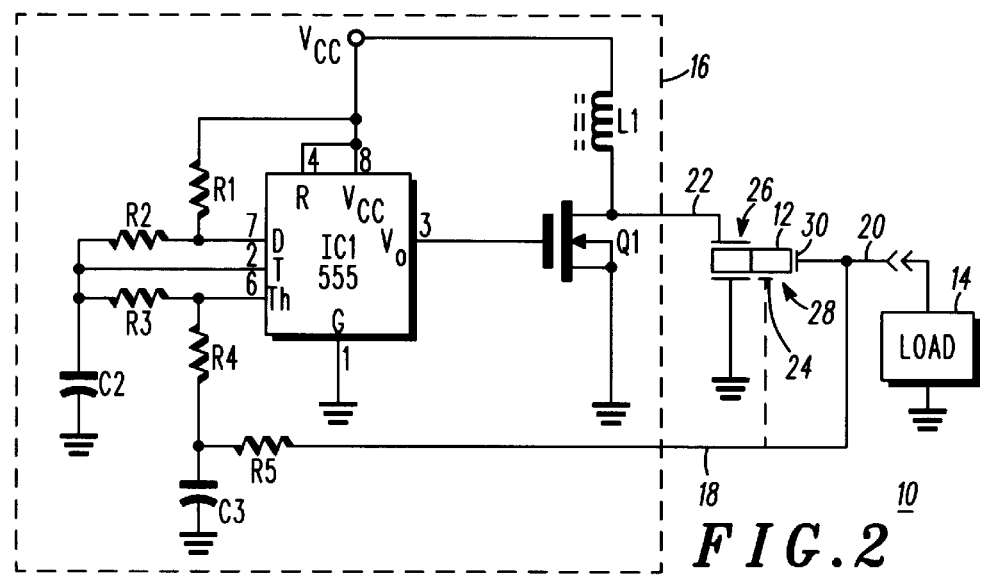
FIG. 2 is a schematic diagram of a first embodiment of a circuit for driving a piezoelectric transformer, in accordance with the present invention.

The particular configuration of the piezoelectric transformer 12 (as represented in FIG. 2) includes an input section 26 and an output section 28. The input section 26 includes a pair of opposing input electrodes. The output section 28 includes an output electrode 30 disposed at an end of the piezoelectric transformer 12 and coupled to a load 14. In this embodiment, the output section 28 provides a feedback phase signal 18. An auxiliary tap 24 can be disposed on the output section 28 in proximity to the input section 26 of the piezoelectric transformer 12. The auxiliary tap 24 can be used advantageously to provide a phase signal 18 of a more usable signal level than that from the output electrode 30. In addition, the auxiliary tap 24 is electrically decoupled from the input section 26, the output electrode 30 and the load 14. There is an additional advantage, in that, the auxiliary tap 24 is previously required in the manufacture of the piezoelectric transformer 12 using different poling directions. During the manufacture of such piezoelectric transformer 12 the auxiliary tap 24 is used to provide proper poling of the output section 28 which is different than the poling of the input section 26. By utilizing the auxiliary tap 24 on the piezoelectric transformer 12, there is no need to eliminate it during processing which saves a processing step.

FIG. 2 shows a first embodiment of the invention including a piezoelectric transformer 12 (such as described above, for example), a phase triggered driving circuit 16, and a load 14. The load 14 is coupled to an output 20 of the piezoelectric transformer 12. The output 20 is also coupled to the phase triggered driving circuit 16 which drives an input of the piezoelectric transformer 12.

The load can be of various different types and configurations. Depending on the application to be met, one of several known output circuits can comprise the load. In one type of load, the output of the piezoelectric transformer can be used to drive an AC device directly, without using any specific intervening components. However, in general, some type of specific output circuit is used. Typically, a DC rectifier circuit, such as a half-wave rectifier, is used to provide a DC output. Furthermore, an impedance matching circuit can be used to match an optimum operating load impedance of the piezoelectric transformer to a particular customer application input impedance. Techniques for providing the various output circuits described above are known in the art and will not be presented here. Preferably, the load is a lamp, such as is used for a LCD backlight, which is directly driven by the AC output of the transformer.

The phase triggered driving circuit 16 includes a timing circuit (IC1) and a power element (Q1). The timing circuit is used to drive the power element directly. The power element drives the input of the piezoelectric transformer 12. The present invention takes advantage of available low cost off-the-shelf components. For example, the timing circuit is a commonly available 555 timer IC. The power element being used is a power FET, such as a IRF511, which is readily available. However, it should be recognized that various different power elements can be used successfully without departing from the novel spirit and scope of this invention.

The phase triggered driving circuit 16 also includes an inductor, L1, which is chosen to resonate with an input capacitance C1 (not represented, but typically 50 nf to 100 nf) of the piezoelectric transformer 12. L1 and C1 form a tank circuit that will resonate at a frequency that is about 10% higher than the resonant frequency of the piezoelectric transformer 12. The resonant frequency is generally within 50 kHz to 100 kHz range for a Rosen-type piezoelectric transformers. Resistors R1, R2 and capacitor C2 are coupled to the timer so as to operate the timer in a stable mode and to preset the frequency of the timer IC. The timer IC is operated with a 40% duty cycle to prevent the power FET from turning on during the tank ring period. However, because the drive is not sinusoidal harmonic frequencies arise which can excite other resonant modes in the piezoelectric transformer. To minimize the possibility of the piezoelectric transformer operating on a frequency mode that is not desired, the components are chosen to operate the timer circuit over a narrow frequency band centered over the desired PT resonance range. A feedback phase signal 18 is taken from the output section 28 of the piezoelectric transformer 12 and is used to phase lock the phase triggered driving circuit 16 to the resonant frequency of the piezoelectric transformer 12.

The phase signal 18 is provided from an output signal 20 generated by the output section 28 of the piezoelectric transformer 12. The output signal 20 can be of a very high voltage. A high voltage phase signal is not necessary for providing feedback and can damage circuitry if not divided down to a more usable signal level. Therefore, it is preferable to use an auxiliary tap 24 disposed on the output section 28 of the piezoelectric transformer 12. The auxiliary tap 24 is located on the output section so as to provide a signal level that is about 5% of a level of the output signal 20.

Advantageously, it is not necessary to actually add an auxiliary tap to the piezoelectric transformer. The tap is already used in the manufacture of the piezoelectric transformer to provide the proper piezoelectric poling of the material of the output section 28 of the piezoelectric transformer 12. In addition, the tap is electrically isolated from the input and high voltage output of the piezoelectric transformer to prevent possible circuit damage. Further, because the tap provides high current, low impedance coupling within a reasonably low impedance range of about 10 ohms to 100 ohms, the tap is a better source for the phase signal 18 than resistive or capacitive coupling directly to the high voltage output signal 20 which could adversely affect the output signal 20.

The phase signal 18 (as provided from the auxiliary tap 24) is coupled to the timer IC through a resistor network. R4 is a decoupling resistor used to isolate the impedance of C3. Resistor R4 couples the phase signal 18 to a threshold input of the timer IC. The ratio of R4 to R3 is about 10:1 so that the normal threshold voltage in a stable mode operation is not substantially reduced. Capacitor C3 and resistor R5 are used to adjust the phase angle of the phase signal 18.

The technique used to lock the timer IC to the piezoelectric transformer is to "overpower" the threshold input of the timer IC. In operation, when the transformer circuit 10 is energized, the output signal 20 of the piezoelectric transformer 12 is zero. The timer is configured in a stable multivibrator mode which advantageously provides self-excitation of oscillation. As the multivibrator begins oscillating, the piezoelectric transformer 12 is driven by the multivibrator via the power FET at close to its resonant frequency (about 10% over resonance).

After a small number of cycles the output signal 20 of the piezoelectric transformer 12 has built up to the point where the voltage at the threshold input of the multivibrator is a component of both a voltage across C2 and a divided voltage across R3. At that point, the multivibrator frequency is above the resonance frequency of the transformer. The level of the feedback signal 18 will increase as the multivibrator frequency decreases towards the resonant frequency, and an increase in level of the feedback signal 18 will cause the multivibrator frequency to further decrease towards the resonant frequency.

Eventually, the signal level of the feedback phase signal 18 has to built up to the point where the threshold trigger point is solely dependent on, and always determined by, the feedback phase signal 18. At this point, the feedback signal has "overpowered" the threshold trigger input and the multivibrator triggers solely on the feedback signal waveform, phase locking the multivibrator frequency to the piezoelectric transformer frequency. The timer chip now behaves like a keyed multivibrator with the frequency forced to the feedback frequency and the duty cycle determined by the choice of component values. As the phase signal decreases to zero, every cycle, the threshold input of the multivibrator is triggered which turns Q1 off and starts the piezoelectric transformer ring period. Also, operating with a 40% duty cycle prevents Q1 from turning back on during the tank ring period.

Advantageously, phase lock is achieved automatically using a simple timing circuit and only a single feedback signal without the need for an external reference frequency, as is needed in prior art phase lock circuits.

The value of C3 and R5 were experimentally determined to provide a phase angle of about 45° for maximum output power from the piezoelectric transformer. Although the output signal 20 from the piezoelectric transformer 12 is maximum at zero phase, the drive signal to the piezoelectric transformer is not a sinusoid. Therefore, the phase angle will not be zero relative to the timer cycle, hence the phase offset.

Advantageously, the 3 db points on a power output of the piezoelectric transformer are about ±190 Hz from the resonant frequency and the phase change within these point is about 45°. Therefore, the present invention provides a substantial feedback gain capability resulting in very stable operation.

In the first embodiment, a piezoelectric transformer with about 75 kHz resonant frequency was used. L1 was 68 $\mu$Hy. C2 was 0.001 $\mu$f. C3 was 220 pf. R1 was 2.7 kohm. R2 was 5.6 kohm. R3 was 10 kohm. R4 and R5 were 100 kohm each.

Figure 3:
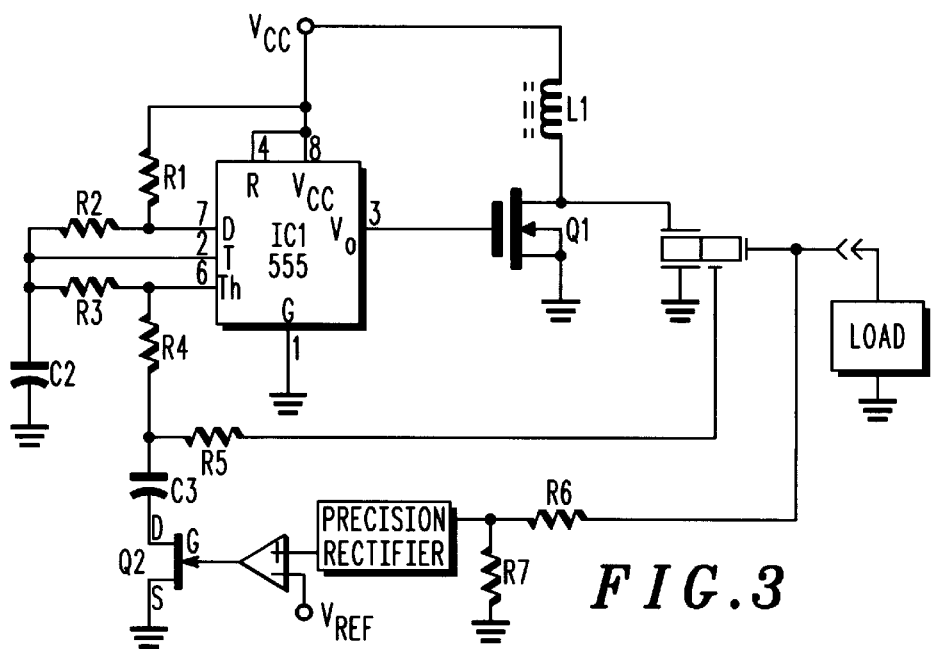
FIG. 3 is a detailed schematic diagram of a preferred first embodiment of a circuit for driving a piezoelectric transformer, in accordance with the present invention.

FIG. 3 shows a preferred first embodiment of the present invention providing increased stability. The preferred first embodiment encompasses the circuit of the first embodiment of FIG. 2, and the description of the first embodiment is hereby incorporated by reference. This embodiment adds phase angle error correction for the phase signal 18 by altering the feedback loop to include active phase adjustment. Phase correction becomes necessary when dynamic loads are driven by the piezoelectric transformer. The piezoelectric transformer is a high impedance device. A dynamic load will affect the resonant frequency of the piezoelectric transformer and also vary the phase shift between the output signal and the motional current, but will not affect the electrically isolated auxiliary tap. Because it is desirable to provide maximum piezoelectric transformer output for real world load changes, the output signal 20 of the piezoelectric transformer is monitored and used to provide phase correction for the feedback phase signal 18.

The preferred first embodiment includes a phase correction network which includes a divider, R6 and R7, coupled to the output signal 20 of the piezoelectric transformer 12 to reduce the high signal level to one that is more usable. The resistor divider, R6 and R7, can be replaced by an equivalent reactance capacitor divider. A capacitor divider is less costly to integrate than the high valued resistors, R6 and R7, and could be more easily integrated, also. Likewise, the current through the load could be regulated by inserting a resistor or capacitor in series with the ground end of the load. In addition, the preferred first embodiment provides a rectifier, or equivalent circuit, being coupled to the divider. The rectifier outputs a signal to a comparator which compares the rectifier output to a reference. The comparator drives variable resistance element, preferably a FET, which is coupled to capacitor C3.

The variable resistance element, Q2, will subsequently alter the phase angle of the phase signal 18 via the phase adjust network, R5 and C3. The use of an optional 0.001 $\mu$f capacitor (not shown) across a gate and source of the FET helps to linearize the FET at the operating frequency (of about 75 kHz). In this way, the loop phase angle is adjusted to maintain a constant output voltage, current or power In the preferred first embodiment, R6 was 24.4 Mohm, R7 was 100 kohm, the precision rectifier and comparator were provided by a TPS7133Q IC from Texas Instruments, and Q2 was a MPF111 FET. Use of the TPS7133Q resulted in about 1% regulation of both line and load in the present invention.

Figure 4:
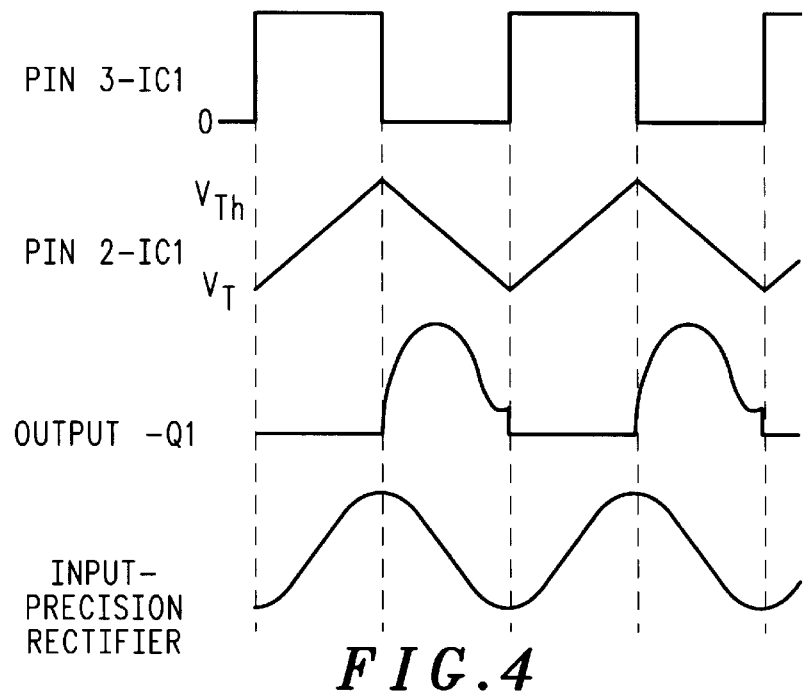
FIG. 4 is a chart of waveforms for use in describing the operation of the input circuit of FIG. 3, in accordance with the present invention.

FIG. 4 shows a chart of waveforms that are useful in illustrating the operation of the preferred first embodiment of the present invention. The first curve shows the signal present at the output (pin 3) of the timer IC where the output is on (high) 40% of the cycle. The second curve shows the signal at the trigger (pin 2) of the timer IC where the switching of the signal is controlled by the timing components. The third curve shows the input to the piezoelectric transformer from the power FET, Q1. The last curve shows the divided-down output signal into the precision rectifier.

Figure 5:
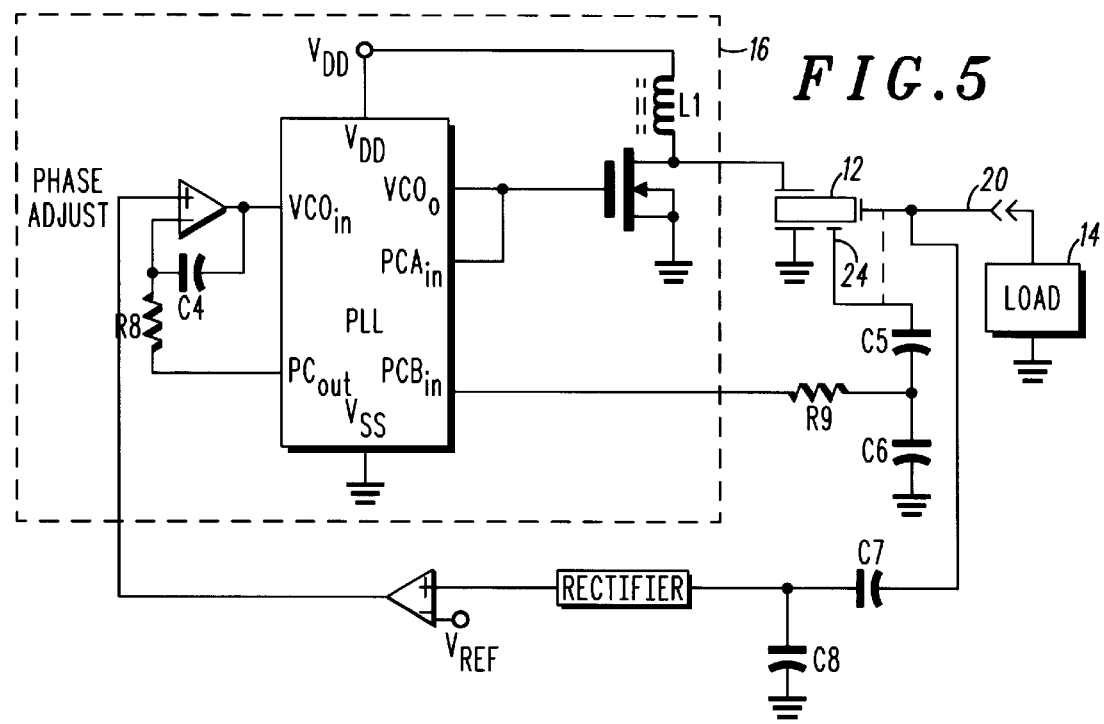
FIG. 5 is a schematic diagram of a second embodiment of a circuit for driving a piezoelectric transformer, in accordance with the present invention.

FIG. 5 shows a second embodiment of the present invention using a conventional phase lock loop (PLL) IC, preferably a MC14046B. However, it was found that the standard configuration for the PLL will not work for the present invention. Achieving a tight phase regulation for a high Q device such as a piezoelectric transformer requires a change of frequency of about 100 Hz or more for a phase change of one degree. The existing PLL IC is not capable of this sensitivity by itself.

One application of this PLL is to track frequency for FM demodulation. For this type of application the tracking ability of the PLL loop is of major importance in that bandwidth of the demodulation is determined by the PLL. The error signal from the phase comparison of the VCO and a reference input controls the VCO frequency. When locked, the two frequencies are the same and the error signal (demodulation) is proportional to the relative phase error.

The present invention is different in that an external reference is not used and a constant phase difference between the oscillator and the piezoelectric transformer is desired. In addition, PLL stability or bandwidth are not required for a piezoelectric transformer application. The present invention couples an integrator with a high DC gain to the PLL IC, between the phase comparator and the VCO input, as shown. In this configuration, only a few seconds of phase difference will produce a large change in oscillator frequency. The RC time constant of R8 and C4 is chosen to minimize other parasitic acoustic resonance modes resulting from certain length, width, thickness, and electrode combinations in a PT design.

Advantageously, the present invention tracks maximum output power transfer to phase angle. If the phase angle is held constant then the oscillator frequency shifts to hold the power transfer constant.

The integrator configuration allows the exact phase angle to be set by applying a phase adjust signal at a "+" comparator input on the op amp, which preferably is a LM324 op amp. In this embodiment a capacitive divider, C5 and C6, was used to obtain the feedback phase signal for the phase comparator. The feedback phase signal is coupled to the PLL via an isolation resistor, R9. Preferably, the phase feedback signal is obtained from an auxiliary tap 24. Alternatively, the phase feedback signal is obtained from the output 20. In this case, the reactance ratio of C5 to C6 is about 1:100 so as to substantially eliminate any capacitive loading of the output 20 while providing an ample signal level for the IC phase comparator input.

Using the same or similar DC regulation as implemented for the first embodiment allows tight voltage regulation by shifting the phase at resonance. In addition, the drive to the piezoelectric transformer can be single ended (as shown) or bridge configured in a push-pull configuration.

In the second embodiment, L1 was 83 $\mu$Hy, R8 and R9 were 100 kohm, C4 was 0.001 $\mu$f, C5 was 1 $\mu$f, and C6 was 0.01 $\mu$f. Phase adjust was set to obtain a 90° phase angle for a lightly resistive output.

A preferred second embodiment of the present invention provides an altered feedback loop to include active phase adjustment similar to the embodiment of FIG. 3 which is hereby incorporated by reference. Phase correction becomes necessary when dynamic loads are driven by the piezoelectric transformer. As the piezoelectric transformer is a high impedance device, a dynamic load will affect the resonant frequency of the piezoelectric transformer and also vary the phase shift between the output signal and the motional current, but will not affect the electrically isolated auxiliary tap. Because it is desirable to provide maximum piezoelectric transformer output for real world load changes, the output signal 20 of the piezoelectric transformer is monitored and used to provide phase correction.

The preferred second embodiment includes a phase correction network which includes a capacitive divider, C7 and C8, coupled to the output signal 20 of the piezoelectric transformer 12 to reduce the high signal level to one that is more usable. The reactance ratio of C7 to C8 is about 1:100 so as to substantially eliminate any capacitive loading of the output 20 while providing an ample signal level for the rectifier. The capacitive divider, C7 and C8, can be replaced by an equivalent reactance resistor divider. However, a capacitor divider is less costly to integrate than high valued resistors, and is more easily integrated. Likewise, the current through the load could be regulated by inserting a resistor or capacitor in series with the ground end of the load. In addition, the preferred second embodiment provides a rectifier, or equivalent circuit, being coupled to the divider. The rectifier outputs a signal to a comparator which compares the rectifier output to a reference, such as a D-to-A output from a laptop computer brightness control or another similar source. The comparator then drives the phase adjust pin of the PLL. The PLL can include the comparator and the voltage reference.

In the first and second preferred embodiments, the circuits of FIGS. 3 and 5 are adapted to drive a dynamic load, such as a cold cathode LCD backlight, for example. The present invention advantageously provides a means for adapting to the dynamic load characteristic of LCD backlights. Also, the present invention can be used with different lamp assemblies while allowing for parasitic capacitance variances between different assemblies.

A piezoelectric transformer for driving devices like LCD backlights must work over a wide (three or more decades) load impedance range, due to the impedance differences between the lamp strike conduction and maximum luminance. Simply holding the frequency constant does not allow enough voltage for both lamp strike and maximum luminance. The wide range of load impedance shifts the frequency necessary for peak voltage output by more than 100 Hz. The present invention allows the transformer frequency to be always locked at a peak output voltage or at a predictable value.

The impedance difference between an unstruck lamp and a lamp at full output power ranges from over 1 Mohm to about 50 kohm. Tracking would not be an issue if the piezoelectric transformer output was a constant voltage. However, a piezoelectric transformer must be operated at resonance to achieve maximum output voltage (or perhaps a slightly different frequency for maximum efficiency). Also, dynamic load changes cause an impedance reflection back into the piezoelectric transformer changing the equivalent motional circuit resonance, and therefore, the resonant frequency.

It is desirable to use the motional current as feedback since the phase of the motional current is zero at peak output voltage. However, the motional current is generally not accessible. In addition, the use of the output signal for feedback can present problems. Resistive or capacitive coupling would be needed in order to tap directly into the output. This affects the loading of the piezoelectric transformer, in addition to the dynamic load changes of the lamp, by inducing a phase shift which is not desirable.

Figure 6:
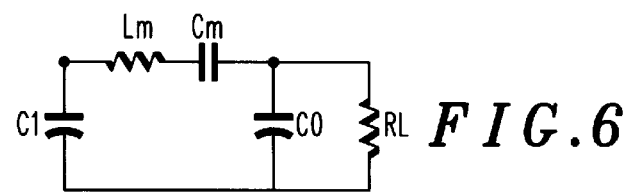
FIG. 6 is a schematic diagram of an equivalent circuit of a piezoelectric transformer and load, in accordance with the present invention.

For example, FIG. 6 shows a simplified model of an equivalent circuit of piezoelectric transformer driving a load, RL. C1 is the low frequency input capacitance of the piezoelectric transformer . Lm and Cm are the equivalent motional inductance and capacitance, respectively, of the resonant mechanical structure. C0 is the low frequency output capacitance in parallel with any load capacitance. RL is the dynamic lamp resistance. It should be noted that both C0 and RL are transformed by the transformer turns ratio. When the lamp is off, RL is substantially open and C0 is in series with Cm. In this case, the piezoelectric transformer resonates at its highest frequency. As RL is lowered it shunts C0 causing resonance to approach the piezoelectric transformer's lowest frequency.

Figure 7:
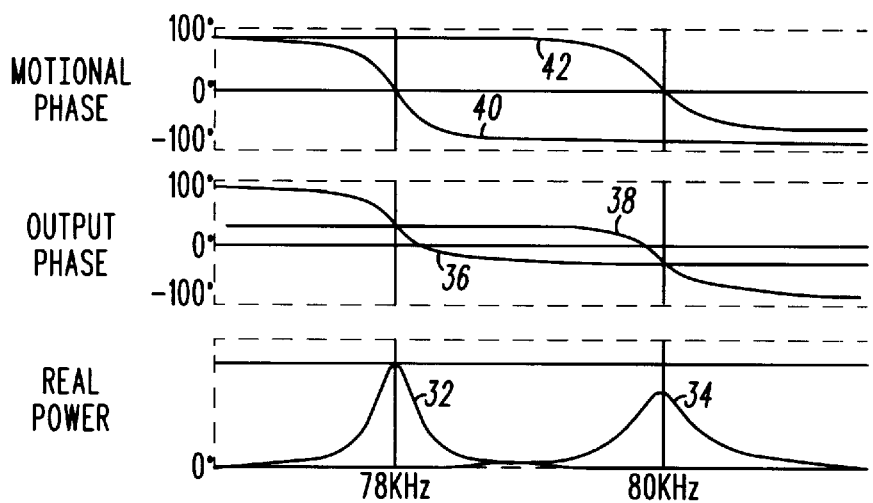
FIG. 7 is a graphical representation of motional and output phase and power of a piezoelectric transformer, in accordance with the present invention.

FIG. 7 illustrates the calculated frequency and phase for two load conditions where RL=10 kohm and RL=1 Mohm with C0=10 pf. The lower curves 32, 34 are the real power into RL. As can be seen, maximum power for a 10 kohm load is at a frequency of about 78 kHz. Maximum power for a 1 Mohm load is at a frequency of about 80 kHz. The middle curves 36, 38 are the phase of the output voltage for both loads. The upper curves 40, 42 are the phase of the motional current for both loads. Note that the phase of the motional current is zero for both load conditions, but the phase of the output voltage is shifted about 90° relative to the two load conditions.

If a PLL is locked at −90° phase of the output voltage at light loads (high RL), then when the load is increased (RL lower) the lock frequency will be at the wrong frequency for maximum power output. Clearly, if the loop could be locked at the phase of only the motional current then maximum output power tracking could be achieved.

Figure 8:
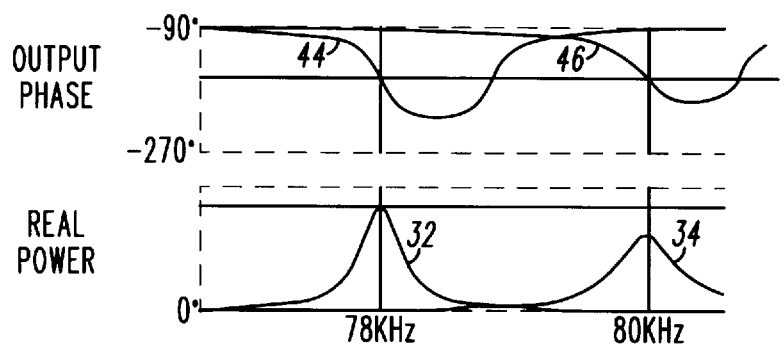
FIG. 8 is a graphical representation of input phase and power of a piezoelectric transformer, in accordance with the present invention.

Obtaining an output for the motional phase does not exist, generally. Phase locking to the output current is troublesome as explained above. Also, phase locking to the input current is troublesome due to the existence of two zero phase points. FIG. 8 shows graphical curves for input current phase 44, 46 at 10 kohms and 1 Mohm, respectively, along with the real power curves for reference. The two zero phase points for either load cause PLL instability unless the frequency can be restricted to a frequency range which only includes one phase point. This is impractical for the narrow frequency band of operation of piezoelectric transformers.

The present invention provides a solution for these problems by providing a feedback signal which follows the motional current phase and which is decoupled from the phase changes associated with the output signal. This is accomplished by utilizing an auxiliary tap (previously represented as 24 in FIGS. 2 and 5) disposed on the piezoelectric transformer. To obtain an voltage output which tracks the motional current, a resistance is placed across the auxiliary output which is substantially lower than the capacitive reactance of the auxiliary tap, preferably to create a voltage proportional to and in phase with the motional current. In this way, the present invention advantageously provides a feedback signal which tracks the motional current at the load impedance extremes of 10 kohm to 1 Mohm.

Figure 9:
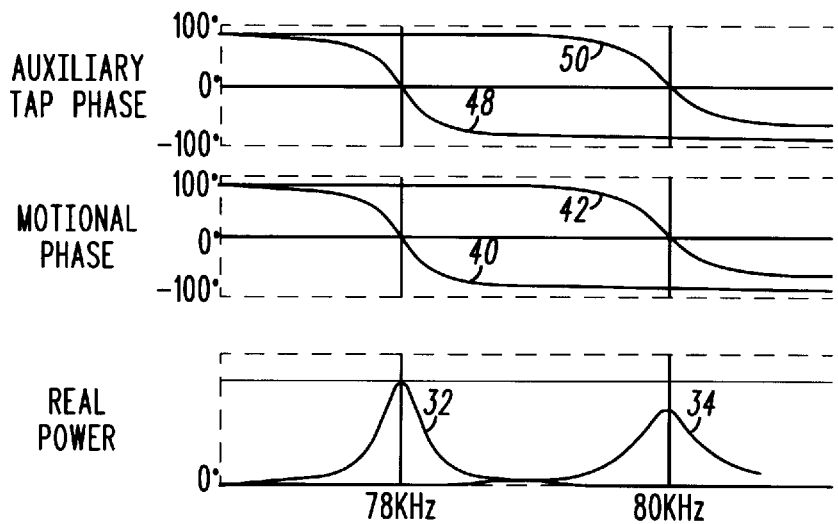
FIG. 9 is a graphical representation of motional and auxiliary tap phase and power of a piezoelectric transformer, in accordance with the present invention.

FIG. 9 illustrates the calculated frequency and phase for a feedback signal from the auxiliary tap for the two load conditions of RL=10 kohm and RL=1 Mohm with C0=10 pf. The real power curves and the motional current curves for both loads are included for reference. The upper curves 48, 50 are the phase at the auxiliary tap for 10 kohm and 1 Mohm loads, respectively. Note that the auxiliary tap signal demonstrates zero phase points corresponding to maximum power output. Therefore the signal from the auxiliary tap can be successfully used to track maximum power output.

The present invention takes advantage of the auxiliary tap by using the zero phase points corresponding to maximum output power for phase locking. Another advantage of the present invention is that the auxiliary tap draws no significant power from the piezoelectric transformer due to its small size and is not significantly capacitively coupled to the output signal. Furthermore, the present invention, although modeled with a 5:1 turns ratio in this example, can be applied to other piezoelectric transformer types including, but not limited to, Rosen, 3rd order, and multi-layered.

The present invention provides a method for driving a piezoelectric transformer in a phase locked configuration. The method includes a first step of providing a 555 timer circuit being operable in an a stable mode and having a trigger input and a threshold input coupled with a divider network, a phase adjust network, and an output signal adaptable for driving the piezoelectric transformer. A second step includes powering the timer circuit such that an oscillating output signal is available to drive the piezoelectric transformer, whereby an output is generated from the piezoelectric transformer when driven at a resonant frequency. A third step includes applying a phase signal available from the piezoelectric transformer to a trigger input of the timer circuit. A last step includes coupling the phase signal to a threshold input of the timer circuit via the divider network. The phase signal triggers the threshold input when the phase signal rises above the threshold providing a lock to a resonant frequency of the piezoelectric transformer.

In a preferred embodiment, the providing step includes the step of providing a phase correction network responsive to phase changes available from the piezoelectric transformer and which applies a phase correction signal to the phase adjust network such that maximum power and efficiency for the piezoelectric transformer is maintained.

This method advantageously provides a phase locked piezoelectric transformer driving circuit using only a single phase input without using a convention PLL circuit. In addition, this method allows the driving circuit to adapt to dynamic loading conditions. Moreover, this method does require the use of a reference signal, and this method provides tracking of the resonant frequency of the piezoelectric transformer so as to operate the piezoelectric transformer at maximum efficiency and power output for dynamic loading conditions.

Although various embodiments of this invention have been shown and described, it should be understood that various modifications and substitutions, as well as rearrangements and combinations of the preceding embodiments, can be made by those skilled in the art, without departing from the novel spirit and scope of this invention.

What is claimed is:

1. A phase locked circuit for driving a dynamic load, comprising:

a piezoelectric transformer having an input and an output section; and a phase triggered driving circuit responsive to a feedback phase signal coupled from the output section, the phase triggered driving circuit outputs a driving signal to an input of the piezoelectric transformer which is phase locked to the feedback phase signal such that the piezoelectric transformer is operable at maximum power and efficiency;

the phase triggered driving circuit includes a phase locked loop circuit including a phase comparator with two inputs and an output and a voltage controlled oscillator with an input and an output, a power element controlled by an output of the voltage controlled oscillator, an inductor switchably coupled to resonate with an input capacitance of the piezoelectric transformer through the power element, a phase adjust network coupled between the phase comparator output and the voltage controlled oscillator input, a feedback phase signal provided from the output section of the piezoelectric transformer being applied to one input of the phase comparator, an output of the voltage controlled oscillator being applied to a second input of the phase comparator so as to lock a frequency of the voltage controlled oscillator to the feedback phase signal.

2. The circuit of claim 1, wherein the output section includes an output electrode for driving the load, the feedback phase signal is coupled from the output electrode to the phase triggered driving circuit.

3. The circuit of claim 1, wherein the output section includes an auxiliary tap and an output electrode for driving the load, the auxiliary tap providing the feedback phase signal and being electrically isolated from the input and the output electrode, the feedback phase signal from the auxiliary tap being of a lower signal level than a level from the output electrode.

4. The circuit of claim 1, wherein the phase triggered driving circuit includes a 555 timer circuit with external components coupled to the timer circuit such that the timer circuit operates as an astable multivibrator, and wherein the power element is controlled by an output of the timer circuit and the phase adjust network is coupled to a threshold input of the timer circuit via a resistor network, the feedback phase signal is applied to overpower the threshold input of the timer circuit so as to lock the timer frequency to the feedback phase signal.

5. The circuit of claim 4, further comprising a phase correction network, and wherein the feedback phase signal is provided from an auxiliary tap disposed on the output section, the phase correction network is responsive to phase changes induced by the dynamic load and applies a phase correction signal to the phase adjust network such that maximum power and efficiency for the piezoelectric transformer is maintained.

6. The circuit of claim 5, wherein the phase correction network includes a divider network, a precision rectifier, a comparator, and a variable resistance element, the divider network couples the output of the piezoelectric transformer to the precision rectifier which outputs a rectified signal to the comparator which compares the rectified signal to a reference, the comparator drives the variable resistance element to vary resistance in the phase adjust network so as to adjust a phase of the feedback phase signal so as to substantially prevent the dynamic load from degrading maximum power and efficiency of the piezoelectric transformer.

7. The circuit of claim 1, wherein the phase adjust network includes an op amp with an output, an inverting input, and a non-inverting input, the output of the op amp is coupled to an input of the voltage controlled oscillator, a capacitor is connected from the output of the op amp to the inverting input, a resistor couples the phase comparator output to the inverting input, and a phase adjust signal is coupled to the non-inverting input, the op amp being configured as an integrator such that the phase locked loop circuit operates over a narrow phase range and a gain of the phase locked loop circuit is substantially increased.

8. A phase locked circuit for driving a fluorescent lamp, comprising:

a piezoelectric transformer having an input and an output section; and a phase triggered driving circuit responsive to a feedback phase signal coupled from the output section, the phase triggered driving circuit outputs a driving signal to an input of the piezoelectric transformer which is phase locked to the feedback phase signal such that the piezoelectric transformer is operable at maximum power and efficiency;

the phase triggered driving circuit includes a phase locked loop circuit including a phase comparator with two inputs and an output and a voltage controlled oscillator with an input and an output, a power element controlled by an output of the voltage controlled oscillator, an inductor switchably coupled to resonate with an input capacitance of the piezoelectric transformer through the power element, a phase adjust network coupled between the phase comparator output and the voltage controlled oscillator input, a feedback phase signal provided from the output section of the piezoelectric transformer being applied to one input of the phase comparator, an output of the voltage controlled oscillator being applied to a second input of the phase comparator so as to lock a frequency of the voltage controlled oscillator to the feedback phase signal.

9. The circuit of claim 8, wherein the phase triggered driving circuit includes a 555 timer circuit with external components coupled to the timer circuit such that the timer circuit operates as an astable multivibrator, and wherein the power element is controlled by an output of the timer circuit and the phase adjust network is coupled to a threshold input of the timer circuit via a resistor network, the feedback phase signal is applied to overpower the threshold input of the timer circuit so as to lock the timer frequency to the feedback phase signal.

10. The circuit of claim 9, wherein the output section includes an output electrode for driving the fluorescent lamp, the feedback phase signal is coupled from the output electrode to the phase triggered driving circuit.

11. The circuit of claim 9, wherein the output section includes an auxiliary tap and an output electrode for driving the fluorescent lamp, the auxiliary tap providing the feedback phase signal and being electrically isolated from the input and the output electrode, the feedback phase signal from the auxiliary tap being of a lower signal level than a level from the output electrode.

12. The circuit of claim 11, further comprising a phase correction network, and wherein the feedback phase signal is provided from an auxiliary tap disposed on the output section, the phase correction network is responsive to phase changes induced by the fluorescent lamp and applies a phase correction signal to the phase adjust network such that maximum power and efficiency for the piezoelectric transformer is maintained.

13. The circuit of claim 12, wherein the phase correction network includes a divider network, a precision rectifier, a comparator, and a variable resistance element, the divider network couples the output of the piezoelectric transformer to the precision rectifier which outputs a rectified signal to the comparator which compares the rectified signal to a reference, the comparator drives the variable resistance element to vary resistance in the phase adjust network so as to adjust a phase of the feedback phase signal so as to substantially prevent impedance changes in the fluorescent lamp from degrading maximum power and efficiency of the piezoelectric transformer.

14. The circuit of claim 8, wherein the phase adjust network includes an op amp with an output, an inverting input, and a non-inverting input, the output of the op amp is coupled to an input of the voltage controlled oscillator, a capacitor is connected from the output of the op amp to the inverting input, a resistor couples the phase comparator output to the inverting input, and a phase adjust signal is coupled to the non-inverting input, the op amp being configured as an integrator such that the phase locked loop circuit operates over a narrow phase range and the gain of the phase locked loop circuit is substantially increased.

* * * * *